United States Patent [19]

Nakamura et al.

[11] Patent Number: 5,734,406
[45] Date of Patent: Mar. 31, 1998

[54] DRIVER IC, A PRINT HEAD HAVING THE DRIVER IC AND A PRINTER INCLUDING THE PRINT HEAD

[75] Inventors: Yukio Nakamura; Hiroshi Furuya; Takashi Ishizaki; Takeyuki Yanagibashi, all of Tokyo, Japan

[73] Assignee: Oki Electric Industry Co., Ltd., Tokyo, Japan

[21] Appl. No.: 224,489

[22] Filed: Apr. 7, 1994

[30] Foreign Application Priority Data

Apr. 12, 1993 [JP] Japan ................... 5-084915

[51] Int. Cl.$^6$ ............... B41J 2/385; B41J 2/435; H01L 23/48
[52] U.S. Cl. ............... 347/132; 347/237; 257/773
[58] Field of Search ............... 347/237, 238, 347/130, 132, 900; 307/69, 157; 257/773, 775

[56] References Cited

U.S. PATENT DOCUMENTS

| 4,478,504 | 10/1984 | Tanaka | 347/132 X |
| 4,536,778 | 8/1985 | De Schamphelaere et al. | 347/130 |
| 4,885,597 | 12/1989 | Tschang et al. | 347/237 |
| 5,309,151 | 5/1994 | Akoi | 347/237 X |
| 5,317,344 | 5/1994 | Beaman et al. | 347/237 |

FOREIGN PATENT DOCUMENTS 62-242558  10/1987  Japan .

*Primary Examiner*—David F. Yockey
*Attorney, Agent, or Firm*—Rabin, Champagne, & Lynt, P.C.

[57] ABSTRACT

A driver IC includes a plurality of electrode pads on a belt-shaped power supply electrode. The electrode pads are arrayed with a pitch dividing a row of driver circuits into groups of equal number. A power source voltage VDD is supplied through the plurality of the electrode pads. Further, the power supply electrode is disposed between the digital circuits and the driver circuits. A print head includes the driver IC with a plurality of light emitting elements connected thereto. A printer includes the print head in combination with photo sensitive drum, a lens array, a charger, a developer and a transcriber.

18 Claims, 7 Drawing Sheets

5,734,406

DRIVER IC, A PRINT HEAD HAVING THE DRIVER IC AND A PRINTER INCLUDING THE PRINT HEAD

CROSS-REFERENCE TO RELATED APPLICATIONS

This application claims the priority right under 35 U.S.C. 119 of Japanese Patent Application No. Hei 05-084915 filed on Apr. 12, 1993, the entire disclosure of which is incorporated herein by reference.

BACKGROUND OF THE INVENTION

1. Field of the Invention

The present invention relates to a driver integrated circuit (hereinafter simply referred as IC) and, more particularly, to a driver IC (IC includes LSI, VLSI or the like) which drives a load, such as a print head or the like which has a light emitting diode (hereinafter referred as LED) therein, a print head which utilizes the driver IC therein, and a printer which has the print head therein.

2. Description of the Related Art

FIG. 7 shows an enlarged plan view of a conventional driver IC. A driver IC 90, which is constituted of a plurality of driver circuits 95 and, a plurality of logic circuits, each having a shift register 91, a latch circuit 92 and an AND circuit 93, is so arrayed that the shift register 91, the latch circuit 92, the AND circuit 93, a wiring line 94 delivering an output signal of the AND circuit 93 and the driver circuit 95 are disposed on a substrate and mutually interconnected in series in this order in a direction from an input electrode N1 toward an output electrode N3. A plurality of circuits in combination constituted of the shift register 91, the latch circuit 92, the AND circuit 93, the wiring line 94 and the driver circuit 95 are arrayed in this order along a longitudinal direction of the driver IC 90 and supplied with each of input signals thereto from the input electrode N1 through each interconnection lines (not shown). The wiring line 94 is made from polycristalline silicon and multi-layer connected with a power supply electrode N4 made from aluminum (Al) or the like through an insulating layer (not shown) made from, for example, silicon dioxide ($SiO_2$) or the like.

The power supply electrode N4, which supplies a power source voltage VDD to the drivers circuit 95 corresponding to each bits, is disposed at the central region of the longitudinal side of the driver IC 90 and a width of the electrode is designed to be wider in order to reduce fluctuation of wiring resistors for each bits and to minimize a voltage drop across the wiring line resistors.

Furthermore, the wiring line 94 is disposed such that a wiring length corresponding to each bits has an equal length with each other.

Note that, in FIG. 7, W represents a width of the driver IC 90; Z a width occupied with a combination of the shift register 91, the latch circuit 92 and the AND circuit 93 along a short edged direction of the driver IC 90; A a width for each one bit of the driver circuit 95; and B a width for each one bit of the shift register 91, the latch circuit 92 and the AND circuit 93, respectively.

Each of circuit pattern sizes of the shift register 91, the latch circuit 92 and the AND circuit 93 can be obtained as the product of the width B and the width Z so that the narrower the width B is, the wider the width Z must be.

However, there have been the following shortcomings in the above described conventional driver IC.

(1) Since the power supply voltage VDD is supplied through the power supply electrode N4 located on the same longitudinal edge of the rectangular driver IC 90 where the input electrodes N1 are also disposed, the power supply electrode N4 located at the central region among the input electrodes is necessitated to be, to some extent, wider in width so that the electrode N4 reveals a fan-like shape expanding in a direction toward the driver circuit 95.

(2) Since the electrode N4 needs to be located at the central region among the input electrodes N1 as described above (1), the width B for each one bit of the shift register 91, the latch circuit 92 and the AND circuit 93 becomes narrow so that the width Z occupied with the shift register 91, the latch circuit 92 and the AND circuit 93 along the short edged direction of the driver IC 90 needs to be widen.

(3) As a result described above (1), the bit width A differs from the bit width B so that the wiring line 94 connecting the AND circuit 93 with the driver circuit 95 can not be a straight line any more but a detour line which makes equal in each wiring length. Accordingly, there arises a problem that the driver IC 90 becomes large in the width W, which results in facing difficulty in manufacture, thereby increasing a cost of the chip.

SUMMARY OF THE INVENTION

It is, therefore, an object of the present invention to provide a driver IC which can be easily miniaturized and can reveal an excellent productability.

Another object of the present invention is to provide a print head utilizing the driver IC.

Further object of the present invention is to provide a printer having the print head therein utilizing the driver IC.

To accomplish the forgoing objects, there is provided a driver IC having:

(a) a plurality of input electrodes for inputting signals therefrom;

(b) a plurality of output electrodes respectively arranged relative to the plurality of input electrodes for outputting driving signals therefrom to drive loads;

(c) a plurality of logic circuits arranged between the input electrodes and the output electrodes for producing logic of the input signals;

(d) a plurality of driver circuits arranged between the logic circuits and the output electrodes for driving signals delivered from the logic circuits and outputting them to the output electrodes; and (e) a power supply electrode for supplying power to the driver circuits;

the power supply electrode being arranged between the logic circuits and the driver circuits.

According to another aspect of the present invention, there is provided a print head having:

(i) a plurality of driver integrated circuits, each including (a) a plurality of input electrodes arranged on a substrate for inputting a print data signal and a strobe signal therefrom;

(b) a plurality of output electrodes respectively arranged on the substrate relative to the plurality of input electrodes for outputting driving signals therefrom to drive loads;

(c) a plurality of logic circuits arranged between the input electrodes and the output electrodes for producing logic of the print data signal and the strobe signal;

(d) a plurality of driver circuits arranged between the logic circuits and the output electrodes for driving signals delivered from the logic circuits and outputting them to the output electrodes; and (e) a power supply electrode arranged between the logic circuits and the driver circuits for supplying power to the driver circuits, and (ii) a light emitting means having a plurality of light emitting elements driven by the driver integrated circuit.

According to further aspect of the present invention there is provided a printer having:

(i) a print head for emitting light driven by a driving signal based on a print data of a video signal for each picture element;

(ii) a converging device for focusing light emitted from the print head;

(iii) a photo sensitive drum for forming an electro static latent image thereon by being exposed with the light focused by the converging device;

(iv) an electro charging device for electrically charging the photo sensitive drum;

(v) a developing device for having a toner adhered to an electro static latent image area formed on a surface of the photo sensitive drum; and (vi) a transcribing device for transcribing the toner on a recording medium;

the print head including a plurality of driver integrated circuits, each having:

(a) a plurality of input electrodes arranged on a substrate for inputting a print data signal and a strobe signal therefrom;

(b) a plurality of output electrodes respectively arranged on the substrate relative to the plurality of input electrodes for outputting driving signals therefrom to drive loads;

(c) a plurality of logic circuits arranged between the input electrodes and the output electrodes for producing logic of the print data signal and the strobe signal;

(d) a plurality of driver circuits arranged between the logic circuits and the output electrodes for driving signals delivered from the logic circuits and outputting them to the output electrodes; and (e) a power supply electrode arranged between the logic circuits and the driver circuits for supplying power to the driver circuits, and a light emitting means having a plurality of light emitting elements driven by the driver integrated circuit.

Since the driver IC is constituted such above in accordance with the present invention, the data signal and the strobe signal input from each input electrodes are processed to perform logical functions by the logic circuit comprising the shift register, the latch circuit and the AND circuit. The processed signals are driven by each driver circuit 95 operating with either the power source voltage or the power source current input from the power supply electrode and are output through each of the output electrodes as the driving signals to external loads.

The power supply electrode is arranged between the plurality of the logic circuits and the plurality of the driver circuits in a belt-shaped manner.

The external power source voltage or the current is input through the plurality of the power supply pads which are arrayed on the power supply electrode with a pitch obtained by equally dividing the plurality of the driver circuits with the same length.

Accordingly, the power source voltage or the power source current is supplied from the vicinity of the driver circuits so that the plurality of the logic and the driver circuits can be arranged with the same pitch.

BRIEF DESCRIPTION OF DRAWINGS

By way of example and to make the description more clear, reference is made to the accompanying drawings in which.

DETAILED DESCRIPTION OF THE PREFERRED EMBODIMENTS

Referring now in detail to the accompanying drawings, description will be made of a driver IC, a print head utilizing the driver IC and a printer into which the print head is incorporated in accordance with the present invention.

Figure 1:
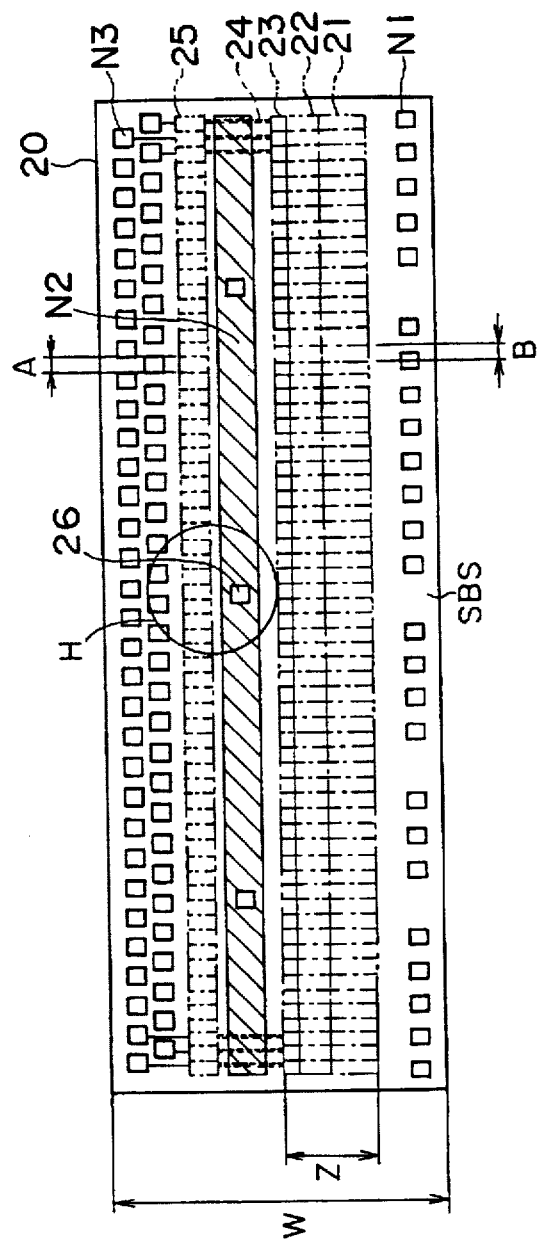
FIG. 1 is a plan view illustrating one embodiment of a driver IC according to the present invention.

FIG. 1 is a plan view illustrating one embodiment of a driver IC according to the present invention which can be applied, for example, to a print head of an LED printer.

Figure 5:
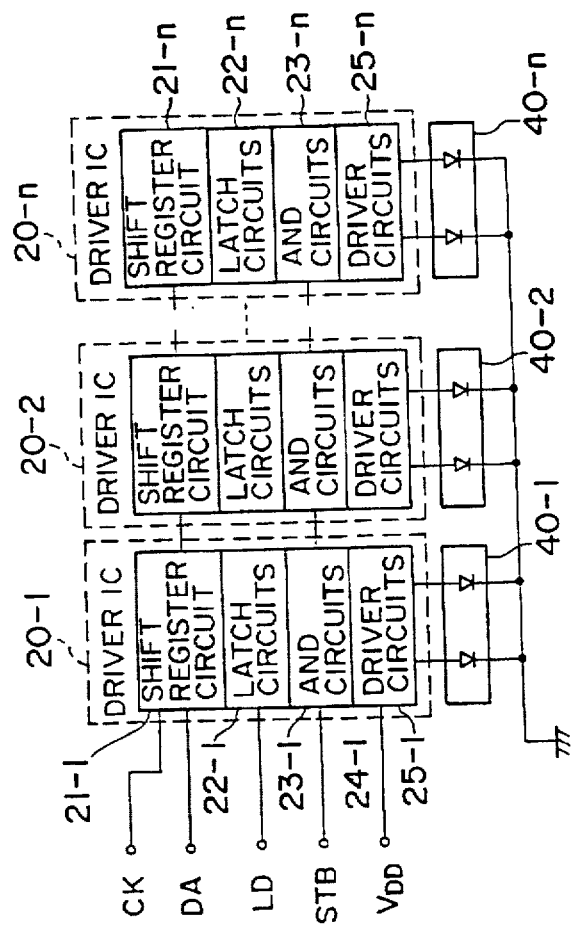
FIG. 5 is a functional block diagram of the LED print head shown in FIG. 4.

In the vicinity of one side of the longitudinal edge of a rectangular driver IC 20, there are provided and arranged a plurality of input electrodes N1 for respectively inputting a printing data DA, a clock signal CK, a load signal LD, and a strobe signal STB, shown in FIG. 5, all of which are transmitted from a controller (not shown) of a printer, whereas there are provided and arrayed a plurality of output electrodes N3 for outputting various driving signals in the vicinity of another side of the longitudinal edge.

The driver IC 20, which is constituted of a plurality of driver circuits 25 and a plurality of logic circuits each including a shift register 21, a latch circuit 22 and an AND circuit 23, is so arrayed that the shift register 21, the latch circuit 22, the AND circuit 23, the wiring line 24 delivering and outputting signal of the AND circuit 23 and the driver circuit 25 are disposed on a substrate and mutually interconnected in series in this order in a direction from an input electrode N1 toward an output electrode N3.

A plurality of circuits in combination constituted of the shift register 21, the latch circuit 22, the AND circuit 23, the wiring line 24 and the driver circuit 25 are arrayed in this order along a longitudinal direction of the driver IC 20 and supplied with each of input signals thereto from the input electrode N1 through each interconnection lines (not shown).

Note that, in FIG. 1, W represents a width of the driver IC 20; Z a width occupied with a combination of the shift register 21, the latch circuit 22 and the AND circuit 23 along a short edged direction of the driver IC 20; A a width for each one bit of the driver circuit 25; and B a width for each one bit of the shift register 21, the latch circuit 22 and the AND circuit 23, respectively.

In the driver IC 20, the widths A and B for each bits are equal with each other and each wiring line 24 extends, in parallel, with a straight line to connect the AND circuit 23 with the driver circuit 25 electrically.

A belt-shaped aluminum power supply electrode N2 is disposed between and in parallel with the AND circuit 23 and the driver circuit 25.

The power supply electrode N2 has a plurality of electrode pads 26 (for example three in FIG. 1) to supply an external power source voltage VDD.

The three electrode pads 26 are disposed on the power supply electrode N2 with a pitch which roughly divides the length of the belt-shaped power supply electrode N2 into three.

The power source voltage VDD is applied to each driver circuit 25 through the three electrode pads 26.

Figure 2:
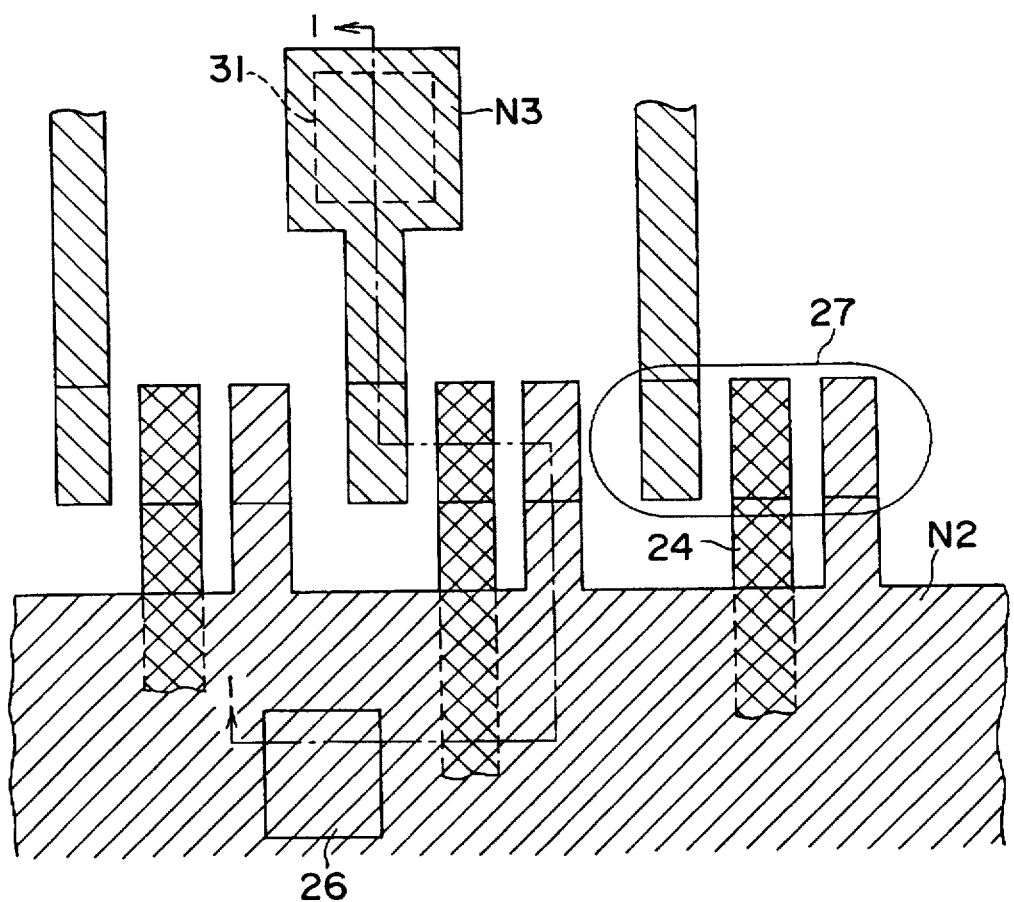
FIG. 2 is a partial enlarged view of a circle H illustrated in FIG. 1.
Figure 3:
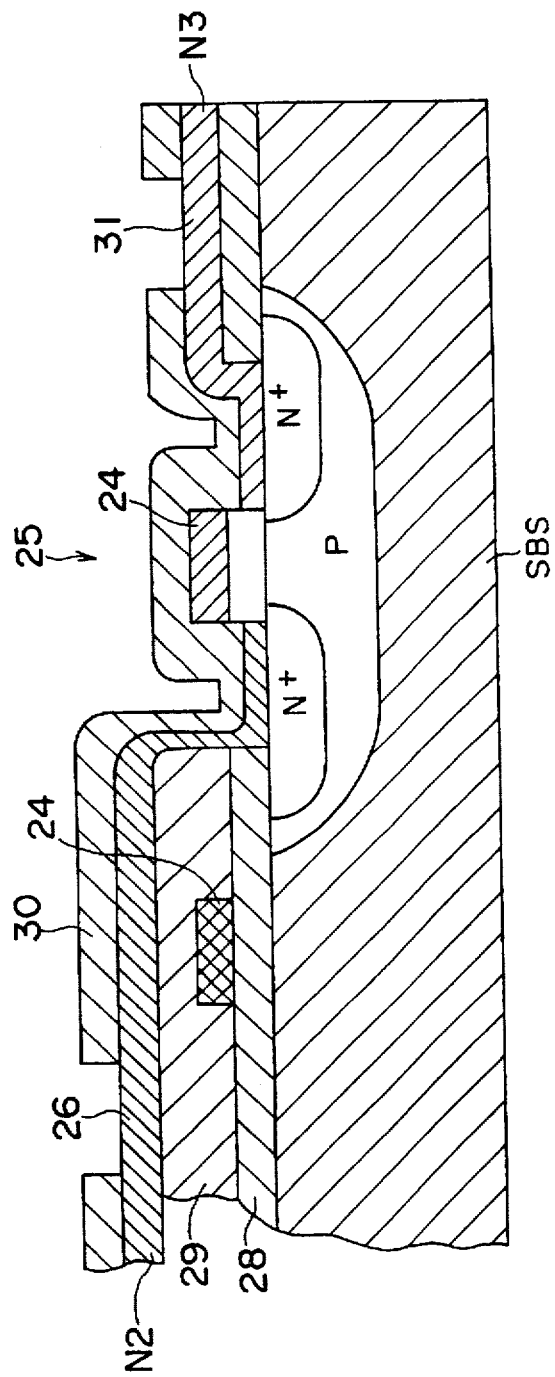
FIG. 3 is a cross sectional view of FIG. 2 taken on the planes of the lines I—I of that figure.

FIG. 2 is a partial enlarged view of a circle H shown in FIG. 1; and FIG. 3 is a cross sectional view of FIG. 2 taken on the planes of the one-dotted lines I—I of that figure.

The driver IC 20 is constituted of C-MOS transistors or the like on a substrate SBS.

An oval 27 shown in FIG. 2 represents a transistor 27 which serves as an one-bit transistor of the driver circuit 25.

Each circuits and wiring lines of the driver IC 20 are electrically isolated by insulating layers 28~30 made from insulating material such as silicon dioxide ($SiO_2$) or the like. The power supply electrode N2 and the output electrode N3 are made from conductive material such as aluminum or the like and the wiring line 24 is made from polycrystalline (poly) silicon or the like.

The driver circuit 25 as shown in FIG. 3 is constituted of an N-channel transistor having source and drain regions formed by ion-implantation of phosphorus or boron into an N-type substrate, and a gate electrode.

The gate electrode of the driver circuit 25 is connected with the wiring line 24 and the source and drain regions are respectively connected with the power supply electrode N2 and the output electrode N3 through conductive material such as aluminum or the like. The power supply electrode N2 and the wiring line 24 are mutually multi-layer connected through the insulating layers 28 and 29.

An insulating layer 30, which is formed on the power supply electrode N2 and the output electrode N3, provides openings at the region corresponding to the electrode pads 26 and 31.

Figure 4:
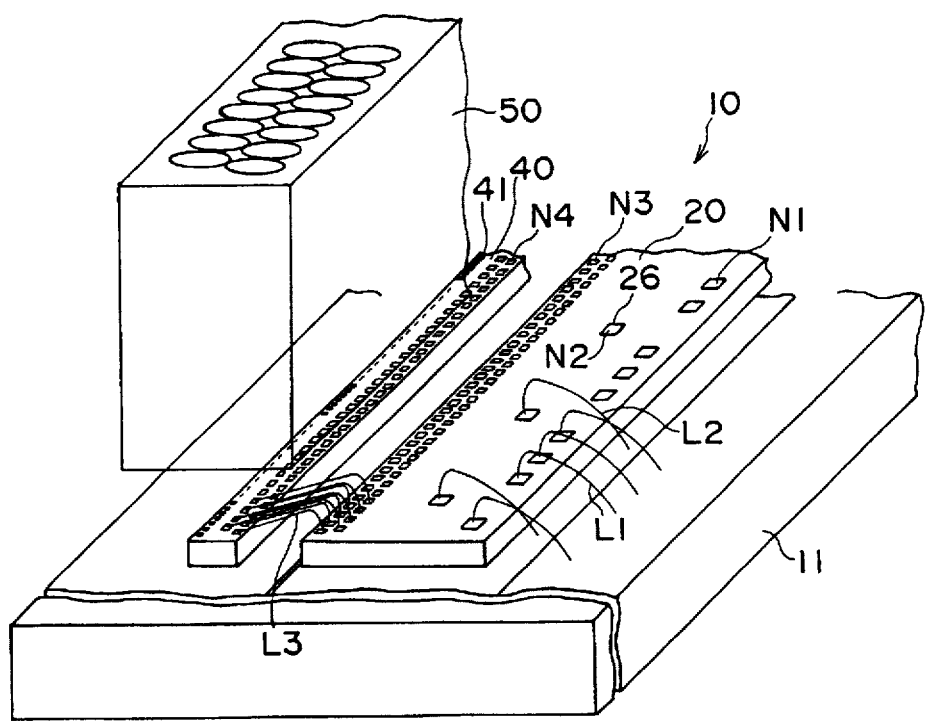
FIG. 4 is a schematic perspective view illustrating an LED print head to which the driver IC shown in FIG. 1 is applied.

FIG. 4 is a schematic perspective view illustrating an LED print head 10 to which the driver IC 20 shown in FIG. 1 is utilized.

The LED print head 10 is constituted of a pattern substrate 11, a plurality of the driver ICs 20 aligned in a straight single line, and a plurality of the LED arrays 40 aligned in a straight single line. The input electrode N1 and the power supply electrode N2 of the driver IC 20 are respectively wire-bonded with the pattern substrate 11 through wires L1 and L2 made from gold or the like, and each output electrode N3 is respectively coupled to the corresponding input electrode N4 of the LED array 40 through a wire L3 also made from gold or the like.

The driver IC 20 and the LED array 40 are securely mounted on the surface of the pattern substrate 11. The LED array 40 emits light through a convergent rod lens array 50.

Assuming dot density be 300 dpi (dots per inch), each LED 41 constituting one dot picture element is aligned with every 84.6 μm pitch so that the LED array 40 formed by monolithically integrating approximately 64 to 128 pieces of the LED 41 is utilized.

When is utilized the LED array having 64 pieces of LED 41 and is performed in A4 size printing, 40 chips of the LED array 40 are employed.

The driver IC 20, which is also constituted of 40 chips, has the same integration density as the LED array 40 has.

FIG. 5 is a functional block diagram of the LED print head 10 shown in FIG. 4, wherein n pieces of chips of the drive ICs 20-1~20-n connected with the LED arrays 40-1~40-n are illustrated.

Each of the driver ICs 20-1~20-n is constituted of each shift registers 20-1~21-n to which a printing data DA and a clock signal CK are input, each latch circuits 22-1~22-n to which a load signal LD is input, each AND circuits 23-1~23-n to which a strobe signal STB is input, and the driver circuits 25-1~25-n to which the power source voltage VDD is applied.

Now, referring to FIG. 5, a light emitting operation of the LED print head driven by the driver IC 20 will be in detail explained.

The printing data DA is consecutively stored as picture element data into each shift registers 21-1~21-n in response to the timing of the clock signal CK.

After all dots of the picture element data are stored in the shift registers 21-1~21-n, the picture element data are respectively output to each latch circuits 22-1~22-n synchronized with the load signal LD, then are respectively output from the latch circuits 22-1~22-n to each AND circuits 23-1~23-n.

The picture element data are processed to have the logic product with the strobe signal STB controlling light turning on or off times of LED, and then respectively output to the driver circuits 25-1~25-n through the wiring line 24. The power source voltage VDD is applied to the driver circuit 25.

A driving current having, for example, 5 mA is generated by the power source voltage VDD and output signals of the AND circuits 23-1~23-n,and output into the LED arrays 40-1~40-n, respectively. Accordingly, each LED 41 turns on or off in response to the printing data DA to print each dots.

Figure 6:
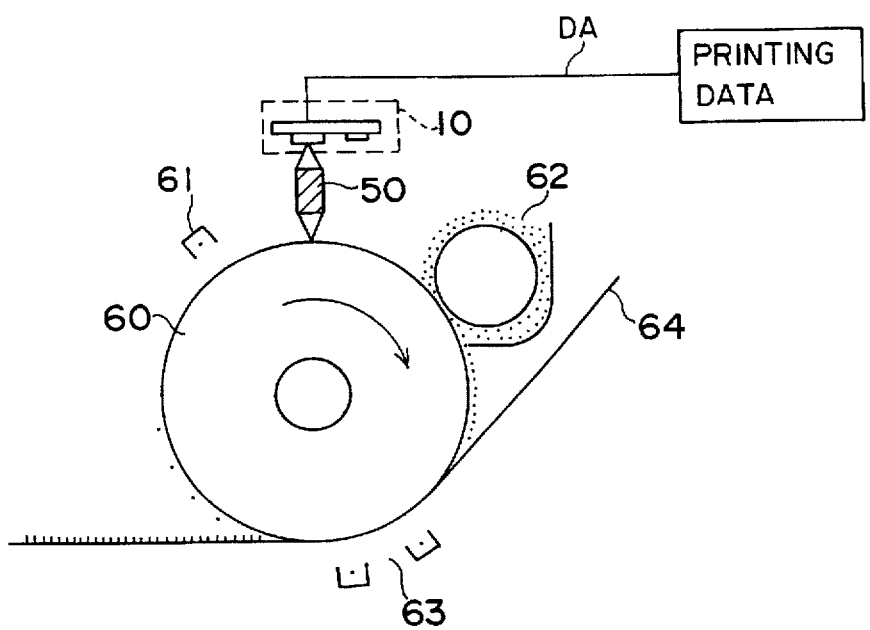
FIG. 6 is a structural view illustrating an LED printer into which the LED print head shown in FIG. 4 is incorporated.
Figure 7:
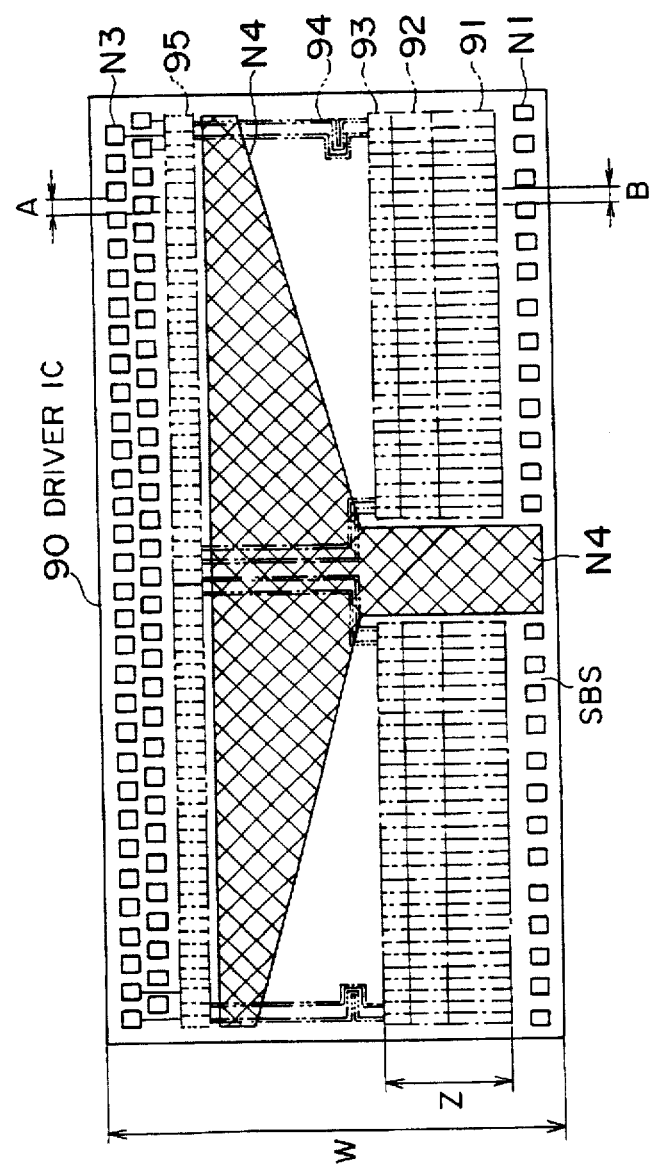
FIG. 7 is a plan view illustrating a conventional driver IC.

FIG. 6 is a schematic structural view illustrating an optical printer into which the LED print head 10 with the driver IC 20 is incorporated. This printer incorporates the LED print head 10 which emits light driven by a driving signal based on the printing data DA such as a video signal or the like corresponding to each picture elements, the convergent rod lens array 50, a photo sensitive drum 60, an electron charger 61, a developer 62, and a transcriber 63. Light emitted by the LED print head 10 propagates through the rod lens array 50, exposes the surface of the photo sensitive drum 60, which rotates in a direction shown with an arrow in FIG. 6 and is charged by the charger 61, and forms electro static latent image on the surface of the drum 60. The latent image is transferred to the developer 62 in rotation with the drum 60, developed by being adhered toner on the electro static latent image region, and transcribed for printing on a paper 64 by the transcriber 63.

As described in detail as to the preferred embodiment of the present invention, the following advantages can be achieved.

(a) Since the power source voltage VDD is supplied at the vicinity of the driver circuit 25 and also supplied with a pitch dividing the driver circuit 25 equally, the power supply electrode N2 can be narrower in width.

(b) Since the longitudinal edge of the driver IC 20 where the input electrode N1 is disposed has a margin in space, the width B for each one bit of the shift register 21, the latch circuit 22 and the AND circuit 23 can be expanded so that the width Z occupied by the shift register 21, the latch circuit 22 and the AND circuit 23 in the short edged direction of the driver IC 20 can be reduced.

(c) Since the widths A and B for each one bit of each circuits are equal with each other, the distance for each bit between the AND circuit 23 and the driver circuit 25 so that the wiring line 24 can be formed as a straight line to minimize the distance by eliminating the detour interconnection.

These advantages bring benefit to narrow the chip width W of the driver IC.

While a preferred embodiment of the present invention has been described, obviously modifications and variations are possible in light of the above teachings without restricted to the forgoing embodiments.

For example, the following variations can be possible.

(A) The MOS transistors constituting the driver circuit 25 can be replaced by the other type transistors such as bipolar transistors which work in the same way as described in the forgoing embodiments.

(B) The AND circuit 23 can be constituted of a transfer gate or the like.

(C) The AND circuit 23 can be constituted of a variety of gate circuits along with its usage.

(D) The driving signal output from the driver IC can be a form of driving voltage along with variations of the load.

(E) The shift register 21 and the latch circuit 22 can be modified along with their objects for usage and also can be omitted.

What is claimed is:

1. A driver integrated circuit, comprising:
   (a) a substrate;
   (b) a plurality of input electrodes arranged on the substrate for receiving input signals;
   (c) a plurality of output electrodes arranged on the substrate for outputting driving signals therefrom to drive loads;
   (d) a plurality of digital circuits arranged on the substrate between the input electrodes and the output electrodes, each of the digital circuits receiving the input signals from respective ones of the input electrodes, and producing a logic signal based on the input signals;
   (e) a plurality of driver circuits arranged on the substrate between the digital circuits and the output electrodes for driving logic signals delivered from the digital circuits and outputting driving signals to the output electrodes, an input of each of the driver circuits being connected to a respective one of the digital circuits and an output of each of the driver circuits being connected to a respective one of the output electrodes; and
   (f) a power supply electrode on the substrate,
   wherein the power supply electrode is a belt-shaped electrode which is arranged between the digital circuits and the driver circuits, the power supply electrode being arranged in parallel with the digital circuits and the driver circuits, the belt-shaped electrode including at least three electrode pads, spaced apart by distances that are approximately equal, to receive power from an external power source, the power supply electrode pads being disposed at a pitch derived by equally dividing the plurality of driver circuits into groups and the power supply electrode being connected to another input of each of the driver circuits for supplying power to the driver circuits.

2. A driver integrated circuit as set forth in claim 1, wherein each of the digital circuits is connected to one of the driver circuits by a single straight conductive line.

3. A driver integrated circuit as set forth in claim 1, wherein the driver circuits have a width and the digital circuits have a width which is equal to that of the driver circuits.

4. A driver integrated circuit as set forth in claim 1, wherein each of the digital circuits comprises a shift register stage, a latch circuit and an AND circuit.

5. A driver integrated circuit as set forth in claim 1, wherein each of the digital circuits comprises a shift register stage, a latch circuit and a transfer gate.

6. A driver integrated circuit as set forth in claim 1, wherein the driver circuits comprise MOS transistors.

7. A driver integrated circuit is set forth in claim 1, wherein the driver circuits comprise bipolar transistors.

8. A print head, comprising:
   (i) a plurality of driver integrated circuits, each including
      (a) a substrate;
      (b) a plurality of input electrodes which are arranged on the substrate for receiving a print data signal and a strobe signal;
      (c) a plurality of output electrodes which are arranged on the substrate for outputting driving signals therefrom to drive loads;
      (d) a plurality of digital circuits which are arranged on the substrate between the input electrodes and the output electrodes and which are responsive to the print data signal and the strobe signal, each of the digital circuits receiving the print data signal and the strobe signal from respective input electrodes, and producing a logic signal based on the print data signal and the strobe signal;
      (e) a plurality of driver circuits which are arranged on the substrate between the digital circuits and the output electrodes for driving logic signals delivered from the digital circuits and outputting driving signals to the output electrodes, an input of each of the driver circuits being connected to a respective one of the digital circuits and an output of each of the driver circuits being connected to a respective one of the output electrodes; and
      (f) a belt-shaped power supply electrode which is arranged on the substrate between the digital circuits and the driver circuits, the power supply electrode being arranged in parallel with the digital circuits and the driver circuits, the belt-shaped power supply electrode including at least three electrode pads, spaced apart by distances that are approximately equal, to receive power from an external power source, the power supply electrode pads being disposed at a pitch derived by equally dividing the plurality of driver circuits into groups, the power supply electrode being connected to another input of each of the driver circuits for supplying power to the driver circuits, and
   (ii) a plurality of light emitting elements, each one of the plurality of light emitting elements being connected to a respective one of the output electrodes of the driver integrated circuit and each one of the plurality of light emitting elements being driven by a respective driver integrated circuit.

9. A print head as set forth in claim 8, wherein each of the the digital circuits is connected to one of the driver circuits by a single straight conductive line.

10. A print head as set forth in claim 8, wherein the driver circuits have a width and the digital circuits have a width which is equal to that of the driver circuits.

11. A print head as set forth in claim 8, wherein the light emitting elements comprise light emitting diodes.

12. A printer, comprising:
    (i) a print head for emitting light, the print head being driven by driving signals based on video signals having print data for each picture element;
    (ii) a converging means for focusing light emitted from the print head;
    (iii) a photo-sensitive drum means responsive to exposure to the light focused by the converging means for forming an electrostatic latent image thereon;
    (iv) an electro-charging means for electrically charging the photo-sensitive drum;
    (v) a developing means, for using toner to develop an electrostatic latent image area formed on a surface of the photo-sensitive drum; and
    (vi) a transcribing means for transcribing the toner onto a recording medium;
    wherein the print head comprises a plurality of driver integrated circuits, each including
    (a) a substrate,
    (b) a plurality of input electrodes which are arranged on the substrate for receiving a print data signal and a strobe signal,
    (c) a plurality of output electrodes which are arranged on the substrate for outputting driving signals therefrom to drive loads,
    (d) a plurality of digital circuits which are arranged on the substrate between the input electrodes and the output electrodes and which are responsive to the print data signal and the strobe signal, each of the digital circuits receiving the print data signal and the strobe signal from respective input electrodes, and producing a logic signal based on the print data signal and the strobe signal,
    (e) a plurality of driver circuits which are arranged on the substrate between the digital circuits and the output electrodes for driving logic signals delivered from the digital circuits and outputting driving signals to the output electrodes, an input of each of the driver circuits being connected to a respective one of the digital circuits and an output of each of the driver circuits being connected to a respective one of the output electrodes, and
    (f) a belt-shaped power supply electrode which is arranged on the substrate between the digital circuits and the driver circuits, the power supply electrode being parallel with the digital circuits and the driver circuits, the power supply electrode including at least three electrode pads, spaced apart by distances that are approximately equal, to receive power from an external power source, the power supply electrode pads being disposed at a pitch derived by equally dividing the plurality of driver circuits into groups, and the power supply electrode being connected to another input of the driver circuits for supplying power to the driver circuits, and
    wherein the print head further comprises a light emitting means having a plurality of light emitting elements, each one of the plurality of light emitting elements being connected to a respective one of the output electrodes of the driver integrated circuit and each one of the plurality of light emitting elements being driven by a respective driver integrated circuit.

13. A printer as set forth in claim 12, wherein each of the digital circuits is connected to one of the driver circuits by a single straight conductive line.

14. A printer as set forth in claim 12, wherein the driver circuits have a width and the digital circuits have a width which is equal to that of the driver circuits.

15. A printer as set forth in claim 12, wherein the converging means comprises a convergent rod lens array.

16. An integrated circuit, comprising:
    a substrate;
    a plurality of drive circuits arranged on the substrate in a row;
    a plurality of digital circuits arranged on the substrate in a row which is substantially parallel to the row of driver circuits;
    a plurality of wiring conductors, the wiring conductors connecting each of the digital circuits to an input of each of the driver circuits; and
    an elongated power supply electrode which is arranged on the substrate between the row of digital circuits and the row of driver circuits, to distribute power from an external power source to the driver circuits, the power supply electrode being connected to another input of each of the driver circuits, the power supply electrode being substantially parallel to the row of driver circuits, the power supply electrode including at least three electrode pads, spaced apart by distances that are approximately equal, to connect to the external power source.

17. An integrated circuit as set forth in claim 16, wherein the power supply electrode has a width that is substantially uniform.

18. An integrated circuit as set forth in claim 16, wherein the digital circuits include AND circuits.

* * * * *